United States Patent
Yang et al.

(10) Patent No.: US 10,886,105 B2
(45) Date of Patent: Jan. 5, 2021

(54) IMPEDANCE MATCHING METHOD, IMPEDANCE MATCHING DEVICE AND PLASMA GENERATING APPARATUS

(71) Applicant: BEIJING NAURA MICROELECTRONICS EQUIPMENT CO., LTD., Beijing (CN)

(72) Inventors: Jing Yang, Beijing (CN); Gang Wei, Beijing (CN); Jing Wei, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/620,841

(22) PCT Filed: May 21, 2018

(86) PCT No.: PCT/CN2018/087612
§ 371 (c)(1),
(2) Date: Dec. 9, 2019

(87) PCT Pub. No.: WO2018/228133
PCT Pub. Date: Dec. 20, 2018

(65) Prior Publication Data
US 2020/0126762 A1    Apr. 23, 2020

(30) Foreign Application Priority Data

Jun. 15, 2017  (CN) .......................... 2017 1 0454753

(51) Int. Cl.
*H01J 37/32*   (2006.01)
*H03H 7/40*   (2006.01)

(52) U.S. Cl.
CPC ......... *H01J 37/32183* (2013.01); *H03H 7/40* (2013.01); *H01J 2237/334* (2013.01)

(58) Field of Classification Search
CPC ....................................................... H03H 7/40
See application file for complete search history.

(56) References Cited

U.S. PATENT DOCUMENTS 7,312,148 B2 * 12/2007 Ramaswamy .... H01L 21/76843
                                                         257/E21.333
9,275,870 B2 *  3/2016 Xu ..................... H01J 37/32091
(Continued)

FOREIGN PATENT DOCUMENTS

CN    1520245 A    8/2004
CN    103730316 A    4/2014

OTHER PUBLICATIONS

World Intellectual Property Organization (WIPO) International Search Report for PCT/CN2018/087612 dated Aug. 9, 2018 5 Pages.

*Primary Examiner* — Amy Cohen Johnson
*Assistant Examiner* — Srinivas Sathiraju
(74) *Attorney, Agent, or Firm* — Anova Law Group, PLLC

(57) ABSTRACT

The present disclosure provides an impedance matching method, an impedance matching device and a plasma generating device. The impedance matching method is implemented for matching an impedance of a load connected to an RF source to an impedance of the RF source, including: selectively performing an automatic matching step or a frequency scan matching step according to an operation mode of the RF source, wherein: in the automatic matching step, instructing a motor to drive an impedance matching network to provide a certain impedance; and in the frequency scan matching step, instructing the motor to stop driving and the RF source to perform a frequency scanning operation. According to the embodiments of the present (Continued)

disclosure, a phenomenon of unstable and non-repetitive matching caused by fast impedance changing during the impedance matching process can be effectively avoided, and a large processing window and process stability can be implemented.

15 Claims, 4 Drawing Sheets

(56) References Cited

U.S. PATENT DOCUMENTS

| | | | | |
|---|---|---|---|---|
| 9,530,620 B2* | 12/2016 | Valcore, Jr. | ........ | H01J 37/32183 |
| 9,591,739 B2* | 3/2017 | Bhutta | ............. | H01J 37/32183 |
| 9,595,423 B2* | 3/2017 | Leray | ................ | H01J 37/32082 |
| 9,734,992 B2* | 8/2017 | Yamada | ............ | H01J 37/32183 |
| 9,788,405 B2* | 10/2017 | Kawasaki | ......... | H01J 37/32146 |
| 9,831,064 B2* | 11/2017 | Konno | ............. | H01J 37/32165 |
| 10,269,540 B1* | 4/2019 | Carter | ............... | H01J 37/32183 |
| 10,546,724 B2* | 1/2020 | Radomski | ........... | H01L 21/3065 |
| 10,573,494 B2* | 2/2020 | Shoeb | ............... | H01J 37/32183 |
| 10,580,618 B2* | 3/2020 | Shoeb | ............... | H01J 37/32146 |
| 10,607,813 B2* | 3/2020 | Fairbairn | ............ | C23C 16/4586 |
| 10,643,822 B2* | 5/2020 | Cheng | ............... | H01J 37/32183 |
| 10,679,825 B2* | 6/2020 | Wu | ........................ | H01J 37/321 |
| 2005/0011453 A1* | 1/2005 | Okumura | ........... | H01J 37/32623 |
| | | | | 118/723 E |
| 2012/0074844 A1* | 3/2012 | York | ........................ | H03H 7/40 |
| | | | | 315/111.21 |
| 2014/0265852 A1* | 9/2014 | Valcore, Jr. | ......... | H01J 37/3299 |
| | | | | 315/111.21 |
| 2016/0126069 A1* | 5/2016 | Kwon | .................... | H05B 31/26 |
| | | | | 315/111.21 |
| 2016/0196958 A1* | 7/2016 | Leray | ................ | H01J 37/32165 |
| | | | | 315/246 |
| 2016/0268100 A1* | 9/2016 | Valcore, Jr. | ....... | H01J 37/32183 |
| 2018/0261430 A1* | 9/2018 | Kawasaki | ......... | H01J 37/32935 |
| 2019/0013182 A1* | 1/2019 | Van Zyl | ............ | H01J 37/32128 |
| 2019/0295820 A1* | 9/2019 | Shoeb | ............... | H01J 37/32183 |

* cited by examiner

IMPEDANCE MATCHING METHOD, IMPEDANCE MATCHING DEVICE AND PLASMA GENERATING APPARATUS

This application is a National Stage entry under § 371 of International Application No. PCT/CN2018/087612, filed on May 21, 2018, and claims priority to Chinese Patent Application No. 201710454753.3, filed on Jun. 15, 2017, the entire contents of which are hereby incorporated as reference.

TECHNICAL FIELD

The present disclosure relates generally to electronic circuit technology, and in particular relates to an impedance matching method, an impedance matching device, and a plasma generating apparatus.

BACKGROUND TECHNOLOGY

In conventional semiconductor fabrication processes, various types of plasma devices have been used. Currently, a widely used plasma source for exciting plasma in a plasma etching equipment is inductively coupled plasma (ICP). Using this technology, a high-density plasma can be obtained at a lower operating pressure, the device has a simple structure with low cost, and can independently control the Radio Frequency (RF) source that generates the plasma (determining the plasma density) and the RF source of the substrate (determining the energy of the particles incident on the wafer).

The RF source of a conventional etching equipment outputs a positive sinusoidal continuous wave. With further development of integrated circuits, the original technical solutions have been unable to meet the requirements for etching processing of 20 nm and below, while the application of new technologies, i.e., pulsed plasma, has achieved breakthroughs in micro-processing. Pulsed plasma technology is used to reduce the plasma induced damage (PID) caused by continuous wave RF energy, to improve the loading effect in the etching process and significantly improve the etching selectivity, and to expand the process adjustment means and window.

In the process of RF energy transmission, the output impedance of the RF source is generally 50 ohms, and the input impedance of the reaction chamber is generally a non-50-ohm impedance value having a real part and an imaginary part. Thus, if energy is directly transferred to the reaction chamber, a reflection of radio frequency energy may occur due to impedance mismatch of the transmission paths, which can cause failure to properly excite plasma in the reaction chamber. Therefore, it is necessary to insert a matching device between the RF source and the reaction chamber so that the input impedance of the back end of the RF source is 50 ohms, which facilitates a normal transmission of the energy.

SUMMARY OF THE INVENTION

In view of this, an objective of the present disclosure is at least in part to provide an impedance matching method, an impedance matching device, and a plasma generating apparatus to effectively achieve impedance matching.

According to one aspect of the present disclosure, an impedance matching method is provided, optionally, for matching the impedance of a load connected to an RF source and the impedance of the RF source, the impedance matching method includes:

Selectively performing an automatic matching step or a frequency scan matching step according to an operation mode of the RF source; wherein: in the automatic matching step, instructing a motor to drive an impedance matching network to provide a certain impedance; in the frequency scan matching step, instructing the motor to stop driving and the RF source to perform a frequency scanning operation.

Optionally, the operating mode of the RF source is a pulsed dual-level mode, and the pulsed dual-level mode includes a high-level phase and a low-level phase;

In the high-level phase, performing the automatic matching step; in the low-level phase, performing the frequency scan matching step. Or, in the high-level phase, performing the frequency scan matching step; in the low-level phase, performing the automatic matching step.

Optionally, a power output by the RF source in the high-level phase is different from a power output in the low-level phase.

According to another aspect of the present disclosure, an impedance matching device for matching the impedance of the load connected to the RF source to the RF source impedance is provided, wherein the impedance matching device comprises:

An impedance matching network;

A motor for driving the impedance matching network to provide a certain impedance; and A controller, according to a received operation mode of the RF source, selectively issuing a first command or a second command, wherein the first command instructs the motor to drive the impedance matching network to provide a certain impedance, the second command instructs the motor to stop driving and the RF source to perform a frequency scanning operation.

Optionally, the operation mode of the RF source is a pulsed dual-level mode, and the pulsed dual-level mode includes a high-level phase and a low-level phase;

In the high-level phase, the controller issues the first command; in the low-level phase, the controller issues the second command;

Or, in the high-level phase, the controller issues the second command; in the low-level phase, the controller issues the first command.

Optionally, a frequency of the RF source may be at least one of: 2 MHz, 13.56 MHz, and 60 MHz.

Optionally, the RF source can be pulse modulated with a modulation frequency of 10 Hz to 20 kHz and a duty ratio of 10% to 90%.

As another aspect of the present disclosure, a plasma generating apparatus includes a RF source, a load connected to the RF source, and impedance matching device for matching the load impedance to the RF source impedance, the impedance matching device uses the above impedance matching device provided by the present disclosure.

Optionally, the plasma generating apparatus comprises an inductively coupled plasma generating apparatus (ICP), a capacitively coupled plasma (CCP) generating apparatus, a microwave plasma generating apparatus or an electron cyclotron resonance plasma (ECR) generating apparatus.

Alternatively, the plasma generating apparatus can be implemented in a plasma etching machine.

Beneficial Effects:

In the technical solution of the impedance matching method and the impedance matching device provided by the present disclosure, a combination of motor-driven impedance matching and frequency scan impedance matching is adopted. Specifically, according to an operation mode of the RF source, an automatic matching step or a frequency scan matching step is selectively performed. Therefore, a phenomenon of unstable and non-repetitive matching caused by fast impedance changing in the impedance matching process can be effectively avoided, and a large processing window and high process stability can be achieved.

The plasma generating apparatus provided by the present disclosure can implement a large processing window and high process stability by using the above-mentioned impedance matching device provided by the present disclosure, and can be applied to a high-precision plasma etching machine.

BRIEF DESCRIPTION OF THE DRAWINGS

In the description of the embodiments of the present disclosure by referring to the accompanying drawings, the above-mentioned and other objectives, features and advantages of the present disclosure will become clear. In the accompanying drawings.

DETAILED DESCRIPTION OF THE EMBODIMENTS

Figure 1:
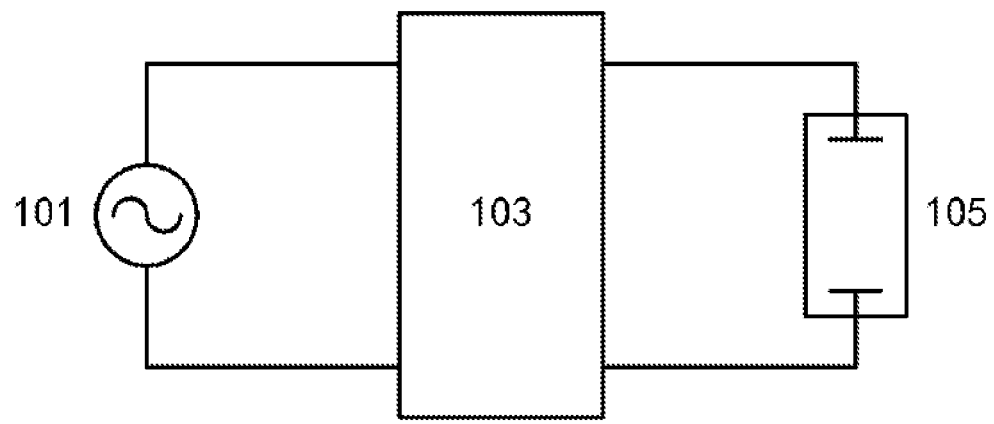
FIG. 1 is a simplified diagram schematically showing a plasma generating apparatus according to one embodiment of the present disclosure.

Hereinafter, embodiments of the present disclosure will be described with reference to the drawings. It should be understood, however, that the description is only illustrative, and is not intended to limit the scope of the disclosure. In addition, descriptions of well-known structures and techniques are omitted in the following description in order to avoid unnecessarily obscuring the concept of the present disclosure.

The terminologies used herein are for the purpose of describing the particular embodiments, and are not intended to limit the present disclosure. The singular forms "a," "an," and "the" are intended to include the plural forms, i.e., "multiple" as well, unless the context indicates otherwise. In addition, the terms "including", "comprising", etc., are used to indicate the presence of the described features, steps, operations and/or components, but do not exclude the presence or addition of one or more other features, steps, operations or components.

All terms (including technical and scientific terms) used herein have the meaning commonly understood by one of ordinary skill in the art, unless otherwise defined. It should be noted that the terms used herein are to be interpreted as having a meaning consistent with the context of the present disclosure and should not be interpreted in an ideal or too rigid manner.

It should also be noted that the directional terms mentioned in the embodiments, such as "upper", "lower", "front", "back", "left", "right", etc., are only referring to the directions of the drawings, and are not intended to limit the scope of the present disclosure. Throughout the drawings, the same elements are denoted by the same or similar reference numerals. Further, the shapes and sizes of the components in the drawings do not reflect the true size and proportion, but merely illustrate the contents of the embodiments of the present disclosure.

Numerical parameters in the specification and the appended claims are approximations, and can vary depending upon the desired characteristics obtained through the disclosure. Specifically, all numbers expressing the content, reaction conditions, etc., which are used in the specification and claims, are to be understood as being modified by the term "about" in all cases. In general, the meaning of its expression refers to a variation including a ±10% of a particular amount in some embodiments, i.e., a variation of ±5% in some embodiments, a variation of ±1% in some embodiments, and a variation of ±0.5% in some embodiments.

Ordinals such as "first", "second", "third", etc. used in the specification and the claims are used to modify the corresponding component, which do not in themselves indicates that such component has any ordinal number, nor the order of one component and another component, or the order in which it is made, or its importance. The use of ordinal numbers is only used to make a component with a certain name clearly distinguishable from another component with the same name.

FIG. 1 schematically shows a simplified diagram of a plasma generating according to one embodiment of the present disclosure.

As shown in FIG. 1, according to this embodiment, the plasma generating apparatus includes a radio frequency (RF) source 101 and a load 105 connected to the RF source 101. In the plasma generating apparatus, the load 105 may include a plasma generating chamber. The RF source 101 is used to provide a certain RF power to excite a variable electric field in the plasma generating chamber. A certain degree of vacuum can be maintained in the plasma generating chamber, and a reacting gas introduced therein can be ionized in the variable electric field and accordingly a plasma is generated. The plasma generating chamber can operate based on a variety of mechanisms, such as inductively coupled plasma (ICP), capacitively coupled plasma (CCP), microwave plasma, electron cyclotron resonance (ECR) plasma, etc.

As described in the background section, the output impedance of the RF source 101 is typically 50 ohms, while as its load the input impedance of the plasma generating chamber is typically a non-50-ohm impedance value having a real part and an imaginary part. In order to avoid the problem caused by the impedance mismatch between the source and the load, an impedance matching device 103 is coupled between the RF source 101 and the plasma generating chamber that is configured as the load, to match the impedance of the plasma generating chamber to the RF source impedance. The configuration of the impedance matching device 103 will be described in further detail below.

Figure 2:
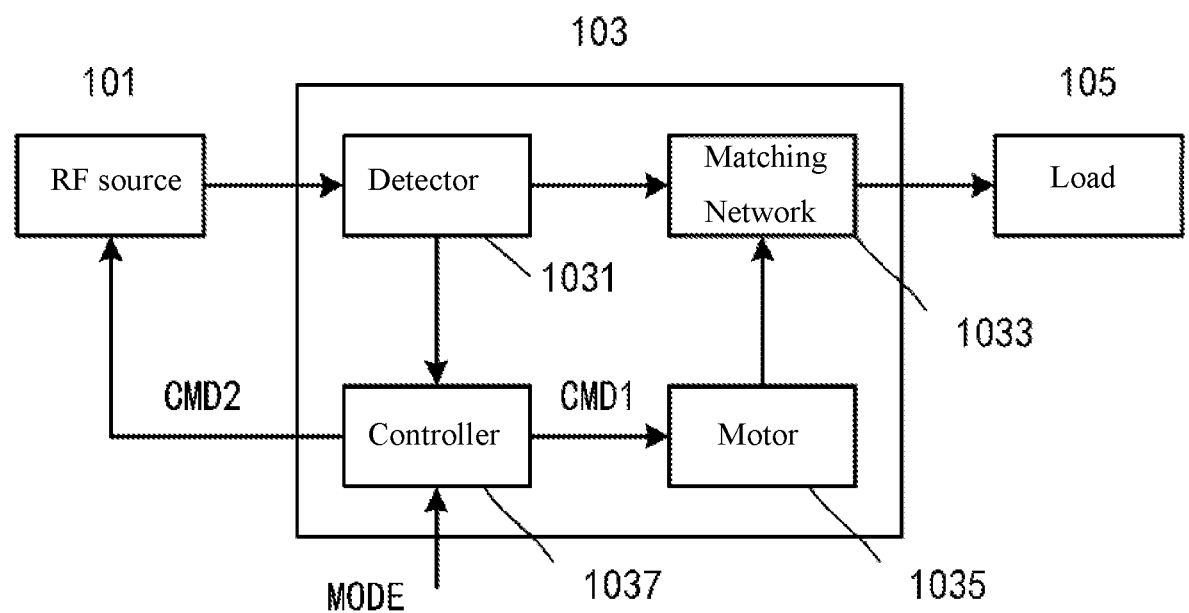
FIG. 2 is a block diagram schematically showing a plasma generating apparatus according to one embodiment of the present disclosure.

FIG. 2 schematically shows a block diagram of a plasma generating apparatus according to one embodiment of the present disclosure.

Similar to the foregoing plasma generating apparatus with reference to FIG. 1, the plasma generating apparatus shown in FIG. 2 also includes an RF source 101, a load 105, i.e., a plasma generating chamber, and an impedance matching device 103 inserted between the RF source and the load 105.

The impedance matching device 103 is for matching the impedance of the load 105 to which the RF source 101 is connected to the RF source 101 impedance. The impedance matching device 103 includes:

An impedance matching network 1033;

A motor 1035 for driving the impedance matching network 1033 to provide a certain impedance; and A controller selectively issuing a first command or a second command based on a received operation mode of the RF source 101, wherein the first command instructs the motor 1035 to drive the impedance matching network 1033 to provide a certain impedance; the second command instructs the motor 1035 to stop driving and the RF source 101 to perform a frequency scanning operation.

Figure 4:
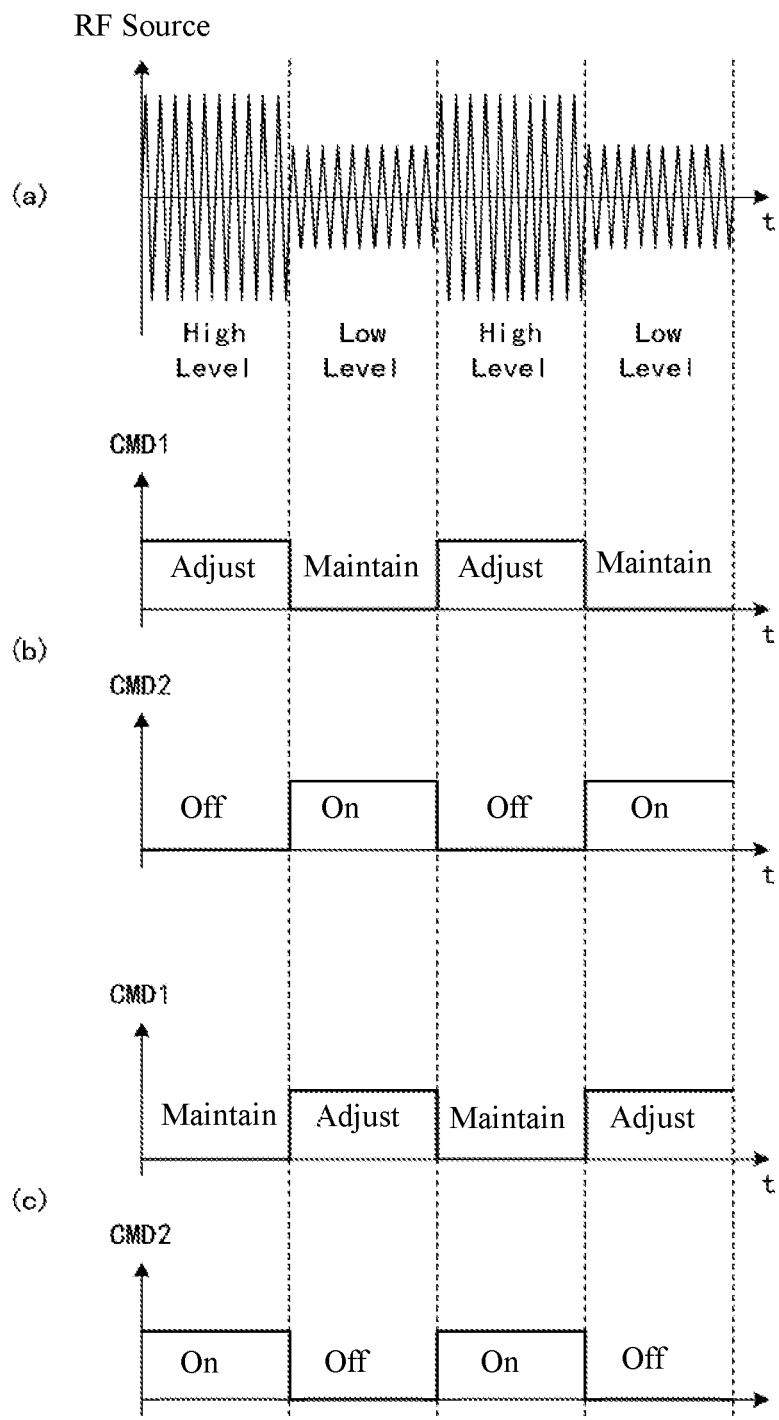
FIG. 4 is a schematic operational timing diagram according to one embodiment of the present disclosure.

The RF source 101 can operate in a pulsed dual-level mode. For example, the RF source 101 can generate RF signals of a certain frequency (e.g., 2 MHz, 13.56 MHz, or 60 MHz, preferably 13.56 MHz). With Pulse Width Modulation (PWM), the RF signals can be modulated into pulsed signals with a high-level and a low-level in one cycle, as shown in FIG. 4(*a*). The pulsed signals promote plasma ignition. In the high-level phase, the pulsed signal can have a higher power, i.e., 1000 W, while in the low-level phase, the pulsed signal can have lower power (not zero), i.e., 600 W. In one example, the modulation signal may have a modulation frequency of about 10 Hz to 20 kHz, and the duty ratio (e.g., the ratio of the high-level phase in a cycle) may be about 10% to 90%. The RF source 101 can output PWM modulated RF signals.

Here, an automatic matching step or a sweep matching step can be selectively performed according to the operation mode of the RF source 101. For example, when the operation mode of the RF source 101 is the foregoing pulsed dual-level mode, in the high-level phase, an automatic matching step is performed; in the low-level phase, a sweep matching step is performed. In an actual application, the operation mode of the RF source 101 can be controlled by outputting the operation mode information MODE. For example, instructing the RF source 101 to perform a high-level phase or a low-level phase, and the operation mode information can be output, for example, by a control unit that controls PWM modulation of the RF signals.

It should be noted that, in practical applications, the sweep matching step can also be performed in the high-level phase; and in the low-level phase, an automatic matching step is performed.

As shown in FIG. 2, the impedance matching device 103 may include an impedance matching degree detector 1031, an impedance matching network 1033, a motor 1035, and a controller 1037.

The impedance matching degree detector 1031 can detect the degree of matching of the load 105 impedance to the RF source impedance. Theoretically, when the load 105 impedance matches the RF source impedance, an RF power from the RF source 101 will all be transmitted to the load 105 without a reflected power from the load 105. Thus, in one example, impedance matching detection can be performed by detecting the incident voltage from the RF source 101 and the reflected voltage from the load 105 and comparing the two voltages by, e.g., calculating a standing wave ratio (SWR). Of course, the present disclosure is not limited thereto, and the impedance matching degree can be detected by other various suitable means. In addition, the impedance matching degree detector 1031 may detect only relevant parameters for deriving the impedance matching degree and send these parameters to the controller 1037 for determining the impedance matching degree, and may not determine the impedance matching degree by itself.

An impedance matching network 1033 is inserted between the RF source 101 and the load 105 to provide a variable impedance thus matching the load 105 impedance to the RF source 101 impedance. The impedance matching network 1033 may include a network connected by impedance components, e.g., capacitive impedance components, resistive impedance components, etc. At least a portion of these impedance components may have a variable impedance configuration such that the impedance matching network 1033 as a whole can present different impedances. For example, the impedance matching network 1033 may include a variable capacitive component. The variable capacitive component may include a rotatable member, i.e., a plate thereof, or a dielectric layer between the plates thereof, the capacitance can be changed by rotating the rotatable member.

The motor 1035 can drive an impedance matching network 1033 to provide a certain impedance. Specifically, a variable impedance component may be a variable capacitive component. For example, the motor 1035 can drive a rotatable member of the variable capacitive component to rotate, thereby changing the capacitance of the variable capacitive component. Motor 1035 can be, for example, a stepper motor.

The controller 1037 can control the overall operation of the impedance matching device 103. In one embodiment of the present disclosure, according to an operation mode of the RF source 101, the controller 1037 may selectively issue a first command CMD1 for the motor 1035 or a second command CMD2 for the RF source 101.

Wherein: the first command CMD1 may instruct the motor 1035 to drive the impedance matching network 1033 to achieve a certain impedance. The first command CMD1 may include a driving information, e.g., direction of rotation, angle of rotation, etc., of the motor 1035, or such information may be provided by other means than the first command CMD1. For example, the controller 1037 may receive the impedance matching degree detected by the impedance matching degree detector 1031, i.e., in terms of SWR, or derive the impedance matching degree based on the parameters detected by the impedance matching degree detector 1031, and obtain the driving information of the motor 1035 based on the impedance matching degree. Accordingly, the motor 1035 can rotate a certain angle, i.e., advance or retreat, based on the received driving information, to change, i.e., increase or decrease, the impedance value provided by the impedance matching network 1033. For example, the controller 1037 can implement control such that SWR changes toward a direction close to 1 until SWR is as close as possible or even equal to 1, which means that the impedance is perfectly matched.

The second command CMD2 may instruct the RF source 101 to perform a frequency scanning operation. For example, the RF signal generator in the RF source 101 can change the frequency of the RF signal it generates within a certain range, e.g., from 12.88 MHz to 14.32 MHz, based on the received second command CMD2. As the frequency of the RF signal changes, the impedance of the impedance matching network 1033 also changes, e.g., the impedance of the capacitor and the inductor changes with the signal frequency. For example, the controller 1037 can implement control such that SWR changes toward a direction close to 1, and such that SWR is as close as possible to or equal to one.

In the different operation modes of the RF sources 101, the motor-driven impedance matching operation and the sweep impedance matching operation can be performed one by one.

According to one embodiment of the present disclosure, in the high-level phase, the controller 1037 may issue the first command CMD1; in the low-level phase, the controller 1037 may issue the second command CMD2. That is, in the high-level phase, the impedance matching network 1033 can be driven by the motor 1035 to provide impedance matching, during which the scanning operation can be stopped; and in the low-level phase, the impedance matching can be provided by the scanning operation of the RF source 101. At this point, the motor can stop driving, for example, remains at the end position from the last driving.

Alternatively, according to one embodiment of the present disclosure, in the low-level phase, the controller 1037 may issue the first command CMD1, and in the high-level phase, the controller 1037 may issue the second command CMD2. That is, in the low-level phase, the impedance matching network 1033 can be driven by the motor 1035 to provide impedance matching, during the scanning operation can be stopped; and in the high-level phase, the impedance matching can be provided by the scanning operation of the RF source 101. At this point, the motor can stop driving, for example, remains at the end position from the last driving.

Figure 3:
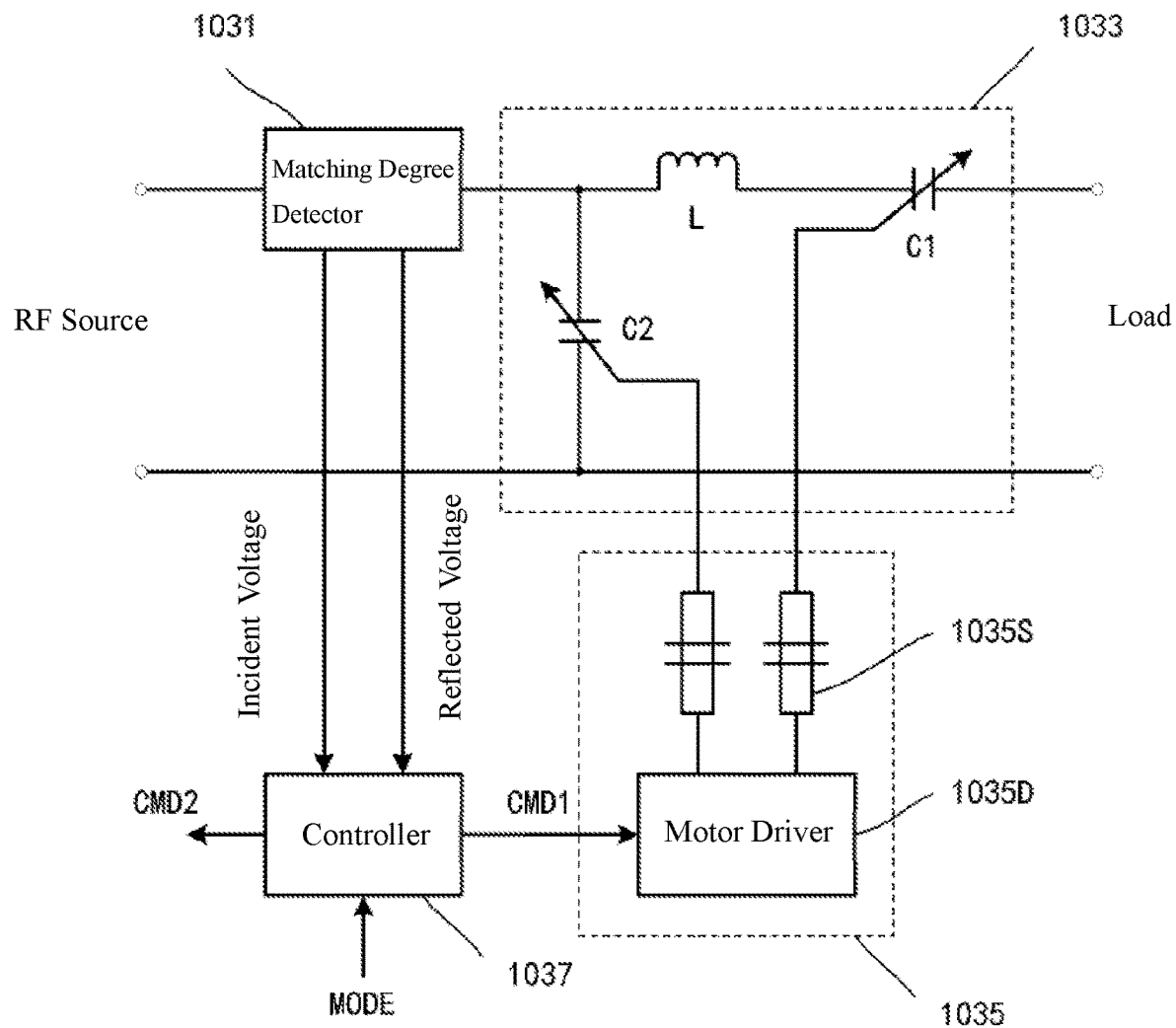
FIG. 3 is a simplified circuit diagram schematically showing an impedance matching device according to one embodiment of the present disclosure.

FIG. 3 schematically shows a simplified circuit diagram of an impedance matching device according to one embodiment of the present disclosure.

In the illustrative embodiment of FIG. 3, an impedance matching network 1033 consisting of an inductive component L and variable capacitive components, C1 and C2, is shown. The variable capacitive components C1 and C2 are series capacitors and parallel capacitors, respectively, to provide different impedance components.

In the embodiment of FIG. 3, the impedance matching degree detector 1031 can detect an incident voltage and a reflected voltage, and transmit the detected incident voltage and reflected voltage to the controller 1037. The controller 1037 can calculate the impedance matching degree, e.g., expressed in SWR, based on the received incident voltage and reflected voltage.

The motor 1035 may include a motor driver 1035D and a pivot shaft 1035S. In this embodiment, corresponding to the two variable capacitive components C1 and C2, the two pivot shafts 1035S may be configured for rotating the rotatable members of the variable capacitive components C1 and C2, respectively. The motor driver 1035D can drive the pivot shaft 1035S to rotate correspondingly based on the driving information received from the controller 1037.

FIG. 4 schematically illustrates an operational timing diagram according to one embodiment of the present disclosure.

As shown in FIG. 4(a), the RF source can operate in a pulsed dual-level mode and thus have alternating high-level and low-level phases.

According to one embodiment, as shown in FIG. 4(b), in the high-level phase, the first command CMD1 may be issued at a high level, instructing the motor to rotate, to drive the impedance matching network to adjust the impedance; and the second command CMD2 can be issued at a low level, instructing the RF source to shut the scanning operation. In the low-level phase, the first command CMD1 can be issued at a low level, instructing the motor to stop rotating, and the motor can remain at an end position from the last high-level phase; and the second command CMD2 can be issued at a high level, instructing the RF source to turn on the scanning operation. The above cycle may be repeated until the RF source stops outputting.

According to one embodiment, as shown in FIG. 4(c), in the high-level phase, the first command CMD1 may be issued at a low level, instructing the motor not to move, and the second command CMD2 may be issued at a high level, instructing the RF source to turn on the scanning operation. In the low-level phase, the first command CMD1 may be issued at a high level, instructing the motor to rotate, to drive the impedance matching network to adjust the impedance; and the second command CMD2 may be issued at a low level, instructing the RF source to shut the scanning operation. The above cycle may be repeated until the RF source stops outputting.

In the conventional technologies, a motor-driven impedance matching network is used for impedance matching in both the high-level phase and the low-level phase. Under this circumstance, if the impedance of the high-level phase and impedance of the low-level phase differ greatly, it can be difficult to achieve impedance matching that satisfies the processing requirements, because it is necessary to constantly switch between the high-level impedance matching position and the low-level impedance matching position, but since the motor response speed cannot keep up with the high-level or low-level impedance switching speed, i.e., PWM frequency, a balance cannot be found and accordingly, there exists a risk of mismatching and eventually the oscillation or reflection may be too large.

Unlike the conventional techniques described above, according to one embodiment of the present disclosure, a combination of motor-driven impedance matching and sweep impedance matching may be employed. Specifically, the automatic matching step or the frequency scan matching step may be selectively performed according to the operation mode of the RF source. Accordingly, a phenomenon of unstable and non-repetitive matching caused by fast impedance changing in the impedance matching process can be effectively avoided, thus achieving a large processing window and high process stability.

As another technical solution, the present disclosure further provides an impedance matching method for matching an impedance of a load connected to an RF source to an impedance of the RF source, and the impedance matching method includes:

Selectively performing an automatic matching step or a frequency scan matching step according to an operation mode of the RF source; wherein:

In the automatic matching step, instructing the motor to drive an impedance matching network to provide a certain impedance;

In the frequency scan matching step, instructing the motor to stop driving and the RF source to perform frequency scanning operation.

Optionally, the operation mode of the RF source is a pulse dual-level mode, and the pulsed dual-level mode may include a high-level phase and a low-level phase.

In the high-level phase, performing the foregoing-described automatic matching step;

In the low-level phase, performing the foregoing-described scan matching step.

The impedance matching method provided by the present disclosure can effectively avoid the phenomenon of unstable and non-repetitive matching caused by the fast impedance changing in the impedance matching process, and can achieve a large process window and high process stability.

In practical applications, the frequency scan matching step can also be performed in the high-level phase; and in the low-level phase, the automatic matching step may be performed.

Optionally, a power output of the RF source in the high-level phase is different from a power output in the low-level phase. Further, in the high-level phase, the pulsed signal may have a larger power, i.e., 1000 W, while in the low-level phase, the pulsed signal may have a lower power (not zero), i.e., 600 W.

As another technical solution, the present disclosure also provides a plasma generating apparatus including an RF source, a load connected to the RF source, and an impedance matching device for matching an impedance of the load to an impedance of the RF source, the impedance matching device employs the above impedance matching device provided by the present disclosure.

The plasma generating apparatus provided by the present disclosure can achieve a large processing window and high process stability by adopting the above-mentioned impedance matching device provided by the present disclosure, and can be applied to a high-precision plasma etching machine.

Figure 5:
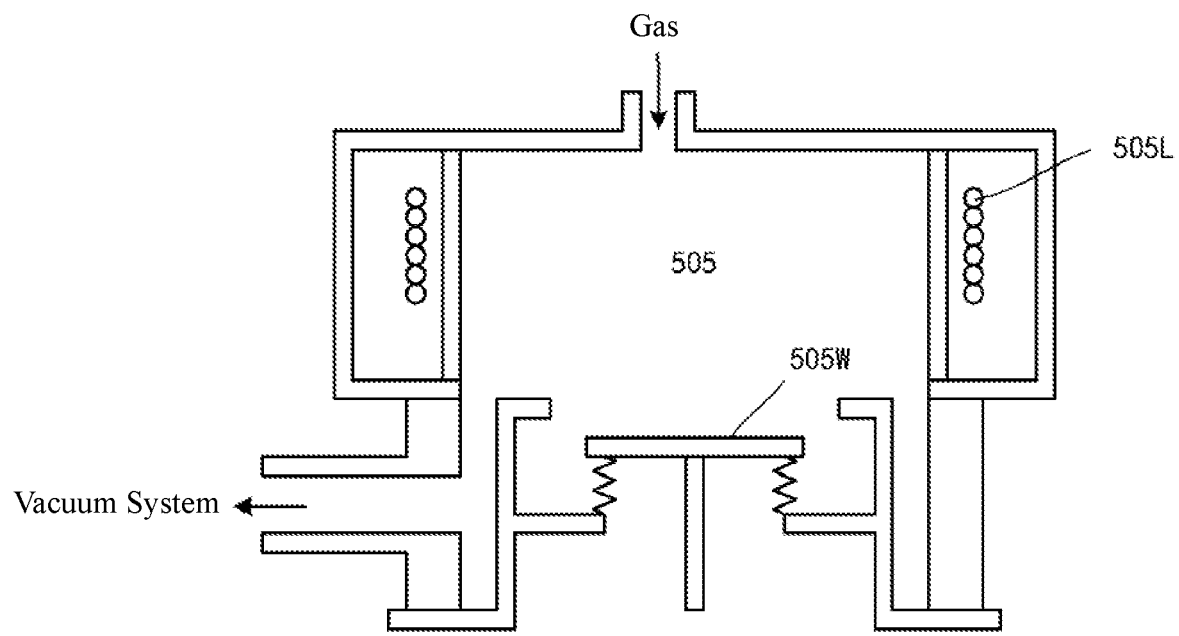
FIG. 5 is a simplified cross-sectional diagram schematically showing a plasma etching machine according to one embodiment of the present disclosure.

In the present embodiment, the plasma generating apparatus described above may be implemented in a plasma etching machine. Specifically, FIG. 5 schematically illustrates a simplified cross-sectional diagram of a plasma etching machine according to one embodiment of the present disclosure. As shown in FIG. 5, the plasma etching machine may include a closed chamber 505. The chamber 505 may be evacuated by a vacuum system to maintain a certain degree of vacuum in the chamber 505. A substrate plate 505W is disposed under the chamber 505, and the substrate may be disposed on the substrate plate 505W for etching. The substrate plate 505W may be connected to the RF source via, i.e., the impedance matching device described above provided by the present disclosure.

A coil 505L can be wound around the upper portion of the chamber 505. The coil 505L may be coupled to an RF source, which can be separated from the RF source of the substrate plate 505W, via an impedance matching device described above to receive RF power. Thus, the coil 505L can induce a variable electric field in the chamber 505. The reacting gas introduced through a gas system may be excited in a variable electric field to generate plasma, and form a plasma, including charged electrons and ions. The gas in the chamber 505, with the electron impact, absorbs energy and forms a large number of reactive groups in addition to being converted into ions. The reactive groups can chemically react with a surface of a material to be etched, e.g., the layer of material formed on the substrate, on a substrate disposed on the substrate plate 505W, and form a volatile reaction product. The reaction product can be detached from the surface of the etched material and extracted by the vacuum system. Alternatively, a DC offset may be applied to the substrate plate 505W to accelerate the impact of the positively charged reacting gas ions against the surface of the etched material. This ion blast can greatly accelerate the chemical reaction on the surface and the detachment of the reaction product, thereby increasing the etching rate.

Although an ICP etching machine is described herein, the present disclosure is not limited thereto. For example, the technology of the present disclosure can also be applied to other plasma etching machines such as capacitively coupled plasma generating devices, microwave plasma generating devices, or electron cyclotron resonance plasma generating devices, etc.

The embodiments of the present disclosure have been described above. However, the examples are for illustrative purposes only and are not intended to limit the scope of the disclosure. Although the various embodiments have been described separately above, this does not mean that the measures in the various embodiments are not advantageously used in combination. The scope of the disclosure is defined by the appended claims and their equivalents. Numerous alternatives and modifications may be made by those skilled in the art without departing from the scope of the present disclosure.

What is claimed is:

1. An impedance matching method, comprising:
receiving, through a controller, operation mode information of the RF source, the received operation mode information indicative of an operation mode of the RF source being a pulsed dual-level mode, the pulsed dual-level mode comprising a plurality of pulse cycles each including a high-level phase and a low-level phase;
generating, through the controller, a first command configured to control an operation of a motor and including high-level phases corresponding to the high-level phases of the plurality of pulse cycles and low-level phases corresponding to the low-level phases of the plurality of pulse cycles;
generating, through the controller, a second command configured to control the RF source and including high-level phases corresponding to the low-level phases of the plurality of pulse cycles;
in response to a high-level phase of the first command, instructing the motor to drive an impedance matching network to provide an impedance to obtain an automatic matching step;
in response to a low-level phase of the first command, instructing the motor to stop and in response to a corresponding high-level phase of the second command, instructing the RF source to perform a frequency scanning operation to obtain a frequency scan matching step; and
for each of the pulse cycles, instructing, through the controller, the motor and the RF source to repeat operations of the automatic matching step in the high-level phase of a corresponding pulse cycle and repeat operations of the frequency scan matching step in the low-level phase of the pulse cycle.

2. The impedance matching method according to claim 1, wherein a power outputted by the RF source in the high-level phase of the pulse cycle is different from a power output by the RF source in the low-level phase of the pulse cycle.

3. An impedance matching device, comprising:
an impedance matching network;
a motor configured for driving the impedance matching network to provide an impedance; and
a controller configured for:
receiving an operation mode information of an RF source, the received operation mode information indicative of an operation mode of the RF source being a pulsed dual-level mode, the pulsed dual-level mode comprising a plurality of pulse cycles each including a high-level phase and a low-level phase;
generating a first command configured to control the motor, the first command including high-level phases corresponding to the high-level phases of the plurality of pulse cycles and low-level phases corresponding to the low-level phases of the plurality of pulse cycles; and generating a second command configured to control the RF source, the second command including high-level phases corresponding to the low-level phases of the plurality of pulse cycles, wherein:

in response to a high-level phase of the first command, the controller is further configured to instruct the motor to drive the impedance matching network to provide an impedance to obtain an automatic matching step;

in response to a low-level phase of the first command, the controller is further configured to instruct the motor to stop and in response to a corresponding high-level phase of the second command, the controller is further configured to instruct the RF source to perform a frequency scanning operation to obtain a frequency scan matching step; and for each of the pulse cycles, the controller is configured to control the motor and the RF source to repeat operations of the automatic matching step in the high-level phase of a corresponding pulse cycle and repeat operations of the frequency scan matching step in the low-level phase of the pulse cycle.

4. The impedance matching device according to claim 3, wherein a frequency of the RF source is at least one of: 2 MHz, 13.56 MHz, or 60 MHz.

5. The impedance matching device according to claim 3, wherein the RF source is pulse-modulated at a modulation frequency range of 10 Hz to 20 kHz and a duty ratio range of 10% to 90%.

6. The impedance matching device according to claim 3, wherein the RF source is modulated by a pulse width modulation method.

7. The impedance matching device according to claim 3, wherein in the high-level phase of the pulse cycle of the RF source, a pulsed signal includes an output power of 1000 W, and in the low-level phase of the pulse cycle of the RF source, a pulsed signal includes an output power of 600 W.

8. The impedance matching device according to claim 3, wherein the operation mode information is outputted by a control unit configured for controlling a pulse width modulation of an RF signal.

9. The impedance matching device according to claim 3, further comprises an impedance matching degree detector.

10. The impedance matching degree detector according to claim 9, wherein an impedance matching degree is measured by a standing wave ratio, the standing wave ratio being based on an incident voltage from the RF source and a reflected voltage from the load.

11. The impedance matching device according to claim 3, wherein the impedance matching network is inserted between the RF source and the load to provide a variable impedance.

12. The impedance matching network according to claim 11, further comprising an impedance component, the impedance component including one or more portions having variable impedance configuration.

13. A plasma generating apparatus, comprising:

an RF source, a load connected to the RF source, and an impedance matching device for matching an impedance of the load to an impedance of the RF source, the impedance matching device comprises:

an impedance matching network;

a motor configured for driving the impedance matching network to provide the impedance of the RF source; and a controller configured for:

receiving an operation mode information of the RF source, the received operation mode information indicative of an operation mode of the RF source being a pulsed dual-level mode, the pulsed dual-level mode comprising a plurality of pulse cycles each including a high-level phase and a low-level phase;

generating a first command configured to control the motor, the first command including high-level phases corresponding to the high-level phases of the plurality of pulse cycles and low-level phases corresponding to the low-level phases of the plurality of pulse cycles; and generating a second command configured to control the RF source, the second command including high-level phases corresponding to the low-level phases of the plurality of pulse cycles, wherein:

in response to a high-level phase of the first command, the controller is configured to instruct the motor to drive the impedance matching network to provide the impedance to obtain an automatic matching step;

in response to a low-level phase of the first command, the controller is configured to instruct the motor to stop and in response to a corresponding high-level phase of the second command, the controller is configured to instruct the RF source to perform a frequency scanning operation to obtain a frequency scan matching step; and for each of the pulse cycles, the controller is configured to control the motor to repeat operations of the automatic matching step in the high-level phase of a corresponding pulse cycle and repeat operations of the frequency scan matching step in the low-level phase of the pulse cycle.

14. The plasma generating apparatus according to claim 13, wherein the plasma generating apparatus is one of: an inductively coupled plasma generating apparatus, a capacitively coupled plasma generating apparatus, a microwave plasma generating apparatus, and an electron cyclotron resonance plasma generating apparatus.

15. The plasma generating apparatus according to claim 13, wherein the plasma generating apparatus is implemented in a plasma etching machine.

* * * * *